United States Patent
Truong et al.

(10) Patent No.: US 10,455,326 B2
(45) Date of Patent: *Oct. 22, 2019

(54) AUDIO FEEDBACK REDUCTION UTILIZING ADAPTIVE FILTERS AND NONLINEAR PROCESSING

(71) Applicant: Polycom, Inc., San Jose, CA (US)

(72) Inventors: Kwan Truong, Liburn, GA (US); Peter L. Chu, Lexington, MA (US)

(73) Assignee: Polycom, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/144,202

(22) Filed: Sep. 27, 2018

(65) Prior Publication Data

US 2019/0253796 A1 Aug. 15, 2019

Related U.S. Application Data

(63) Continuation of application No. 15/942,148, filed on Mar. 30, 2018, now Pat. No. 10,117,021.

(60) Provisional application No. 62/480,106, filed on Mar. 31, 2017.

(51) Int. Cl.
| | |
|---|---|
| *H04R 3/02* | (2006.01) |
| *H03G 5/02* | (2006.01) |
| *G11B 27/031* | (2006.01) |
| *H04R 27/00* | (2006.01) |
| *H03G 5/16* | (2006.01) |

(52) U.S. Cl.
CPC ............ *H04R 3/02* (2013.01); *G11B 27/031* (2013.01); *H03G 5/025* (2013.01); *H03G 5/165* (2013.01); *H04R 27/00* (2013.01); *H04R 2227/007* (2013.01); *H04R 2430/03* (2013.01)

(58) Field of Classification Search
CPC ...... H04R 3/02; H04R 3/005; H04R 2430/03; H03G 5/025
See application file for complete search history.

(56) References Cited

U.S. PATENT DOCUMENTS

| 9,754,597 B2 * | 9/2017 | Jot ....................... G10L 19/0204 |
| 2008/0189116 A1 * | 8/2008 | LeBlanc ................ H04M 3/002 704/500 |
| 2009/0059821 A1 * | 3/2009 | Wu ........................ H04M 9/082 370/286 |

(Continued)

*Primary Examiner* — Nafiz E Hoque
(74) *Attorney, Agent, or Firm* — Blank Rome, LLP

(57) ABSTRACT

Traditional audio feedback elimination systems may attempt to reduce the effect of the audio feedback by simply scaling down the audio volume of the signal frequencies that are prone to howling. Other traditional feedback elimination systems may also employ adaptive notch filtering to detect and "notch" the so-called "singing" or "howling" frequencies as they occur in real-time. Such devices may typically have several knobs and buttons needing tuning, for example: the number of adaptive parametric equalizers (PEQs) versus fixed PEQs; attack and decay timers; and/or PEQ bandwidth. Rather than removing the singing frequencies with PEQs, the devices described herein attempt to holistically model the feedback audio and then remove the entire feedback signal. Two advantages of the devices described herein are: 1.) the system can operate at a much larger loop-gain (and hence with a much higher loudspeaker volume); and 2) setup is greatly simplified (i.e., no tuning knobs or buttons).

20 Claims, 4 Drawing Sheets

(56) References Cited

U.S. PATENT DOCUMENTS

| | | | | |
|---|---|---|---|---|
| 2009/0304178 A1* | 12/2009 | Takada | ............... | H04M 9/082 |
| | | | | 379/406.08 |
| 2014/0023188 A1* | 1/2014 | Fadili | ............... | H04B 3/23 |
| | | | | 379/406.01 |
| 2016/0295322 A1* | 10/2016 | Orescanin | ............... | H04R 3/005 |
| 2017/0169838 A1* | 6/2017 | Dehghani | ............... | H04M 9/082 |

* cited by examiner

AUDIO FEEDBACK REDUCTION UTILIZING ADAPTIVE FILTERS AND NONLINEAR PROCESSING

CROSS-REFERENCE TO RELATED APPLICATION

This application is a continuation of U.S. patent application Ser. No. 15/942,148 filed Mar. 30, 2018, which claims priority to U.S. provisional patent application No. 62/480,106 filed on Mar. 31, 2017, the contents of which are incorporated herein in their entirety by reference.

TECHNICAL FIELD

The present disclosure relates generally to reducing audio feedback in audio systems, such as public address (PA) systems. More particularly, but not by way of limitation, the present disclosure relates to techniques for modeling audio feedback paths with multiple adaptive filters in order to remove the feedback spectrum in its entirety.

BACKGROUND

Audio feedback in PA systems can cause problems ranging from irritation to equipment damage. The feedback phenomenon may occur, for example, when loudspeaker audio is re-captured by a microphone and re-amplified continuously, forming a feedback loop exceeding the system's stability margin. The method used in most small PA systems to eliminate audio feedback is to simply lower the loudspeaker volume until room audio no longer squeals and howls. More sophisticated PA systems may be acoustically treated with wall-mounted panels and Digital Signal Processor (DSP) parametric equalizers (PEQs). Another method of attempting to eliminate audio feedback is to add an automatic feedback elimination device to the PA system itself.

BRIEF DESCRIPTION OF THE DRAWINGS

For the purpose of illustration, there are shown in the drawings certain embodiments described in the present disclosure. In the drawings, like numerals indicate like elements throughout. It should be understood that the full scope of the inventions disclosed herein are not limited to the precise arrangements, dimensions, and instruments shown. In the drawings.

DETAILED DESCRIPTION

Figure 1:
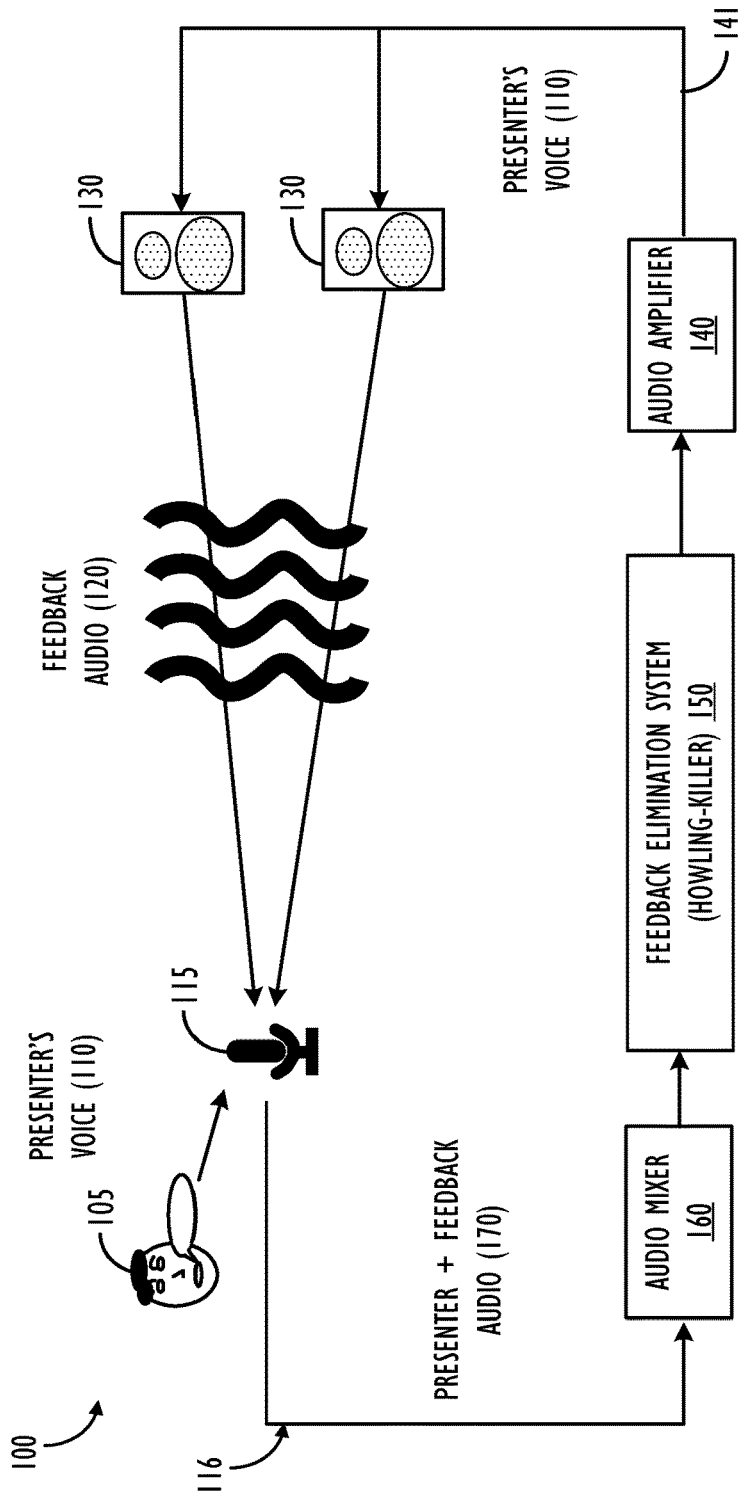
FIG. 1 illustrates a block diagram of an exemplary embodiment of an exemplary PA system comprising a feedback elimination system, in accordance with an exemplary embodiment disclosed herein.

Reference to the drawings illustrating various views of exemplary embodiments is now made. In the drawings and the description of the drawings herein, certain terminology is used for convenience only and is not to be taken as limiting the embodiments of the present disclosure. Furthermore, in the drawings and the description below, like numerals indicate like elements throughout.

A single subband data structure, e.g., according to typical audio feedback elimination systems, may be used to transform the time domain representation of the audio signal into N subbands. For example, for a time domain signal sampled at 48 Khz, the spectrum bandwidth is 24 Khz, and a 256-subband decomposition will divide the spectrum into 256 bins where each bin is 93.75 Hz (i.e., 24,000/256). Subbands are more amenable to analysis such as echo cancellation and noise shaping. Once the initial processing is done, the processed subband signal can be "synthesized" to recover the time domain signal.

In accordance with the embodiments disclosed herein, there is provided a system for providing an improved audio feedback elimination system. According to some embodiments, the system comprises a dual-subband data structure with a crossover frequency. For a dual subband data structure, e.g., using 128 and 256 subbands, the spectrum may decomposed twice, i.e., once with 256 subbands and once with 128 subbands. Many parts of the non-overlapping regions of the spectrum may then be zeroed out because only one of the two subband regions is needed to recover the original time domain signal. According to some such embodiments, the crossover frequency may be 1000 Hz, wherein: between 0 to 1000 Hz, a 256-subband frame may be used (equating to a 5.333 msec frame epoch for performing one subband decomposition, i.e., 256/48,000); while, above 1000 Hz, a 128-subband frame may be used (equating to a 2.666 msec frame epoch for performing one subband decomposition, i.e., 128/48,000). (According to studies, the human mind tends to subjectively focus on consonants in spoken audio, which mostly have energy above 1000 Hz.) According to some such embodiments, both frequency regions may be overlap-added to reconstruct the processed output audio frame. Advantages of such a system include a low delay output, but also good low frequency resolution to improve the convergent performance of the adaptive filter.

In accordance with other embodiments disclosed herein, the data structures for each subband may have two adaptive filters, i.e., a fast (or 'transient') filter tap and a slow filter tap. According to some such embodiments, small step-sizes may be used to ensure that the biased (i.e., correlated) microphone and loudspeaker signals do not diverge the adaptive filter taps.

In accordance with still other embodiments disclosed herein, one or more of the filter taps may be smoothed with a first-order Infinite Impulse Response (IIR) filter across the time (i.e., frame index) duration of the audio signal. The smoothing may be used to reduce some of the 'roughness' from the filtered output, i.e., due to frequent updating of the filter taps in the presence of 'local' audio (i.e., 'overlapping' audio). (The terms 'local' or 'overlapping' audio, as used herein, refer to audio spoken by someone in the local room (i.e. at the 'near site' location); whereas the term 'nonlocal' audio, as used herein, refers to 'single talk' (i.e., audio from the loudspeaker via the 'far site' location)). In PA systems, when the acoustic feedback canceller (AFC) faces the condition of both 'nonlocal' audio and 'local' audio overlapping, it is typically caused by the feedback loop.

According to still other embodiments, normalized nonlinear echo suppression may be used to greatly reduce the reverberation and correlation of the filtered output—while preserving the same loudness level in the output audio signal.

FIG. 1 shows a block diagram of an exemplary PA system 100. PA system 100 may be operated by one or more presenters 105. The presenter's voice (110) may be captured by a microphone 115 or other audio input device. According to the audio path 116 traveling counterclockwise from microphone 115, the presenter 105's voice, along with any feedback audio captured by the microphone 115 (the combination of which are represented by audio signal 170), are passed to an audio mixer device 160. FIG. 1 further illustrates how the feedback elimination device 150 is located with path 116 between the audio mixer 160 and an amplifier 140. Output from audio mixer device 160 passes to the feedback elimination device 150, and then to the audio amplifier 140. The amplified audio signal 141 can then pass then pass the presenter's voice (i.e., with as much feedback as possible eliminated) 110 to one or more speakers 130. The audio output of the speakers 130 may, in turn, be picked up again by microphone 115, i.e., in the form of feedback audio 120, thus creating the aforementioned unwanted feedback phenomenon. It is to be understood that other components—a recording device, for example—may be present within path 116 without departing from this disclosure.

Traditional feedback elimination systems have attempted to reduce the effect of the audio feedback by simply scaling down the audio volume of the signal frequencies that are prone to howling. By contrast, the feedback elimination device 150 (i.e., the "Howling-Killer") described herein is designed to remove the entire feedback audio spectrum. The terms Acoustic Feedback Canceller (AFC) and Howling-Killer may be used interchangeably in this document.

Other feedback elimination systems may also employ adaptive notch filtering to detect and "notch" the so-called "ringing," "singing," or "howling" frequencies as they occur in real-time. "Ringing" and "singing" are similar phenomenon, in that, they refer to feedback conditions wherein one or more tones are emanating from the loudspeaker. While "ringing" typically is used to describe tones with a constant amplitude, "singing" may be used to describe tones that are increasing in amplitude. "Howling" refers to the strong squealing feedback sound that typically occurs after the PA system undergoes singing for a second or less. Such devices may typically have several knobs and buttons to tune, for example: the number of adaptive PEQs versus fixed PEQs; attack and decay timers; and/or PEQ bandwidth. Notch filtering-based acoustic feedback elimination methods can achieve 3 dB to 6 dB of additional loop gain in a PA system, but typically require a great deal of tuning in the setup phase.

Rather than attempting to remove singing frequencies by simply using PEQs, the embodiments described herein attempt to holistically model the feedback audio and then systematically remove the entire feedback signal, (or significantly reduce the feedback signal). There are at least two advantages of the Howling-Killer over typical adaptive notch filtering methods. One advantage is that the Howling-Killer PA system can operate at a much larger loop-gain (and hence with a much higher loudspeaker volume with no audio feedback), and another is that the Howling-Killer PA system can be setup easily, (for example, within a completely plug-and-play system having neither tuning knobs nor buttons).

Due to the feedback path in PA systems such as exemplary PA system 100 shown in FIG. 1, the loudspeaker and microphone signals tend to be highly correlated—a condition that is vastly different from a conventional acoustic echo canceller (AEC), wherein loudspeaker (i.e., remote) and microphone (i.e., local) signals are uncorrelated. When two stochastic signals are highly correlated, their cross-correlation is non-zero—a condition that typically causes adaptive filtering to have a poor convergent property. In a typical AEC environment, the loudspeaker signal comprises the spoken words from the 'far site,' while the microphone signal comprises the spoken words from the 'near site.' Thus, these signals are referred to as 'non-correlated.' Therefore, conventional AEC systems have a better convergent property than that of a typical audio feedback canceller. The correlation between the loudspeaker and microphone signals in a typical PA system creates an undesirable condition known as the "biased least square estimate," which highly degrades the convergent properties of an adaptive filter.

Figure 2:
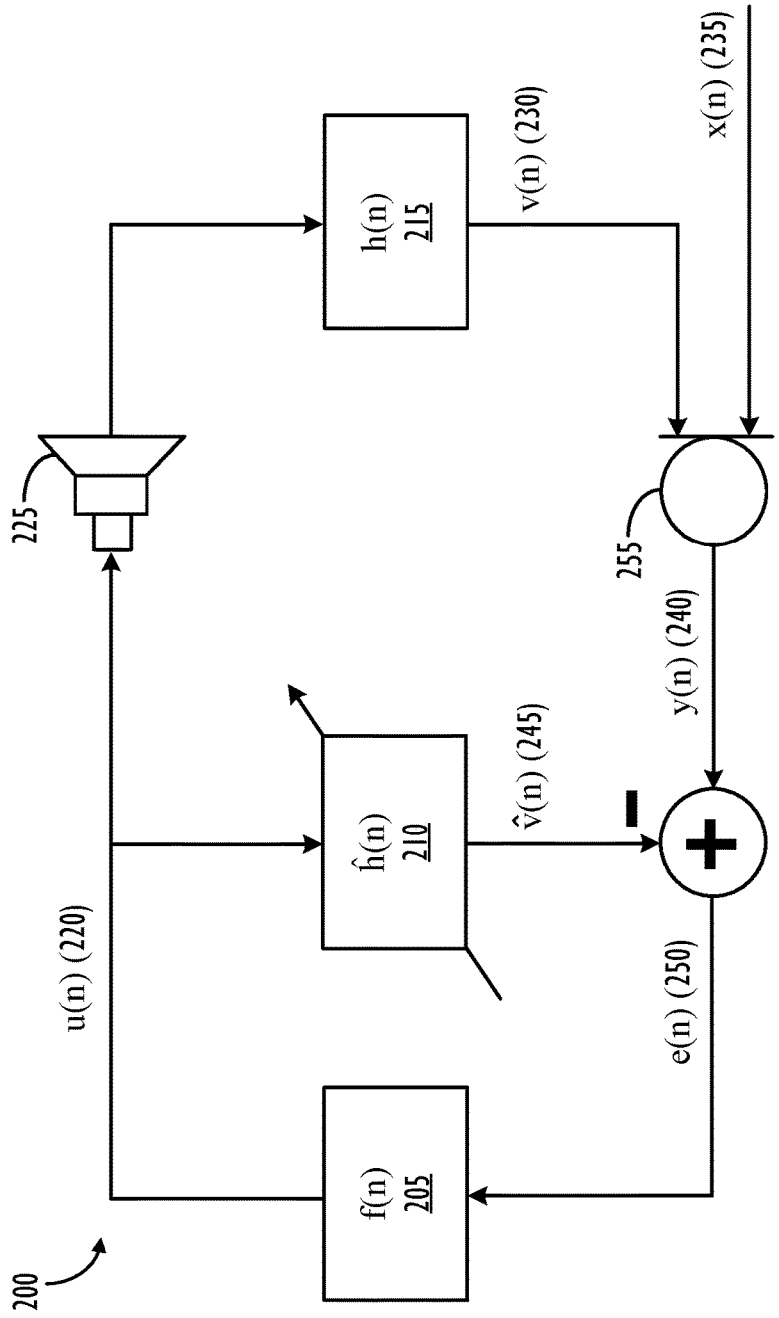
FIG. 2 illustrates a block diagram of a simplified mathematical model of an Acoustic Feedback Canceler (AFC), in accordance with one or more exemplary embodiments disclosed herein.

FIG. 2 shows a block diagram 200 of a simplified mathematical model of an Acoustic Feedback Canceler (AFC), in accordance with one or more exemplary embodiments disclosed herein. As shown in FIG. 2, the objective of the AFC is to model the room transfer function h(n), which, in this discussion, is assumed to be a vector of length L. At any given time, n, h(n)=[h(n), h(n−1), ..., h(n−L+1)]. Similarly, the column loudspeaker signal vector (220) is represented as $u(n)=[u(n), u(n-1), \ldots, u(n-L+1)]^T$.

According to FIG. 2, the microphone signal (240), at any given time n, can be expressed as $$y(n)=x(n)+v(n)=x(n)+u^T(n)h(n) \quad \text{(Eqn. 1)}$$

where v(n) (230) is the loudspeaker (225) output as seen by the microphone (255), and x(n) (235) is the local room audio. As stated earlier, in a normal AEC without the feedback path the signal, x(n) (235) and v(n) (230) are completely uncorrelated—a condition that greatly improves the convergence property of the adaptive filter.

The optimal h(n) (210) that best approximates the actual room response h(n) (215) is the Wiener-Hopf equation in the form of $$h_0(n)=R_{uu}^{-1}(n)r_{uy}(n) \quad \text{(Eqn. 2)}$$

where $R(n)=E[uu^T]$ is the expectation of the autocorrelation matrix of the loudspeaker vector, and $r_{uy}(n)=E[u(n)y(n)]$ is the expectation of the cross correlation vector of the loudspeaker vector and the microphone signal y(n) (240). Substituting Equation 1 into 2 yields:

$$\begin{aligned} h_0(n) &= E[uu^T]^{-1} E[u(n)y(n)] \\ &= E[uu^T]^{-1} E[u(n)\{x(n) + u^T(n)h(n)\}] \\ &= E[uu^T]^{-1} E[u(n)x(n)] + E[u(n)u^T(n)h(n)] \\ &= E[uu^T]^{-1} E[u(n)x(n)] + E[h(n)] \end{aligned} \quad \text{(Eqn. 3)}$$

The first term on the right side of Equation 3 is known as the biased term, and will be zero if u[n] is uncorrelated to (independent of) x(n). Thus, for a conventional AEC, Equation 3 becomes:

$$h_0(n)=E[h(n)] \text{ if } E[u(n)x]=0 \quad \text{(Eqn. 4)}$$

The Normalized Least Mean Square (NLMS) updating rule in the adaptive filter is derived from the steepest decent algorithm based on the optimality of the Wiener-Hopf equation as stated in Equation 2, which simplifies to Equation 4 for a conventional AEC.

However, due to the non-zero cross correlation between the loudspeaker and the microphone signals, the corresponding NLMS updating rules of typical feedback cancellers have shown poor convergence properties and have reproduced filtered output with a great deal more perceptual artifacts than the output of the adaptive filter in a conventional AEC.

The signal $v_{hat}(n)$ (245) represents the estimate of the acoustic feedback signal v(n), which is the convolution of the reference signal u(n) (220) and the adaptive filter $h_{hat}(n)$ (210). The residual signal e(n) (250) is the difference of the microphone input y(n) (240) subtracted by the acoustic feedback estimate signal $v_{hat}(n)$ (245). The function f(n) (205) represents all of the nonlinear processing that is applied to the residual signal e(n) (250) to form the loudspeaker signal u(n) (220). Such nonlinear processing may include, e.g.: echo suppression, noise suppression, and time domain feedback suppression (i.e., scaling down the signal gain).

Dual-Subband Analysis Filter

Figure 3:
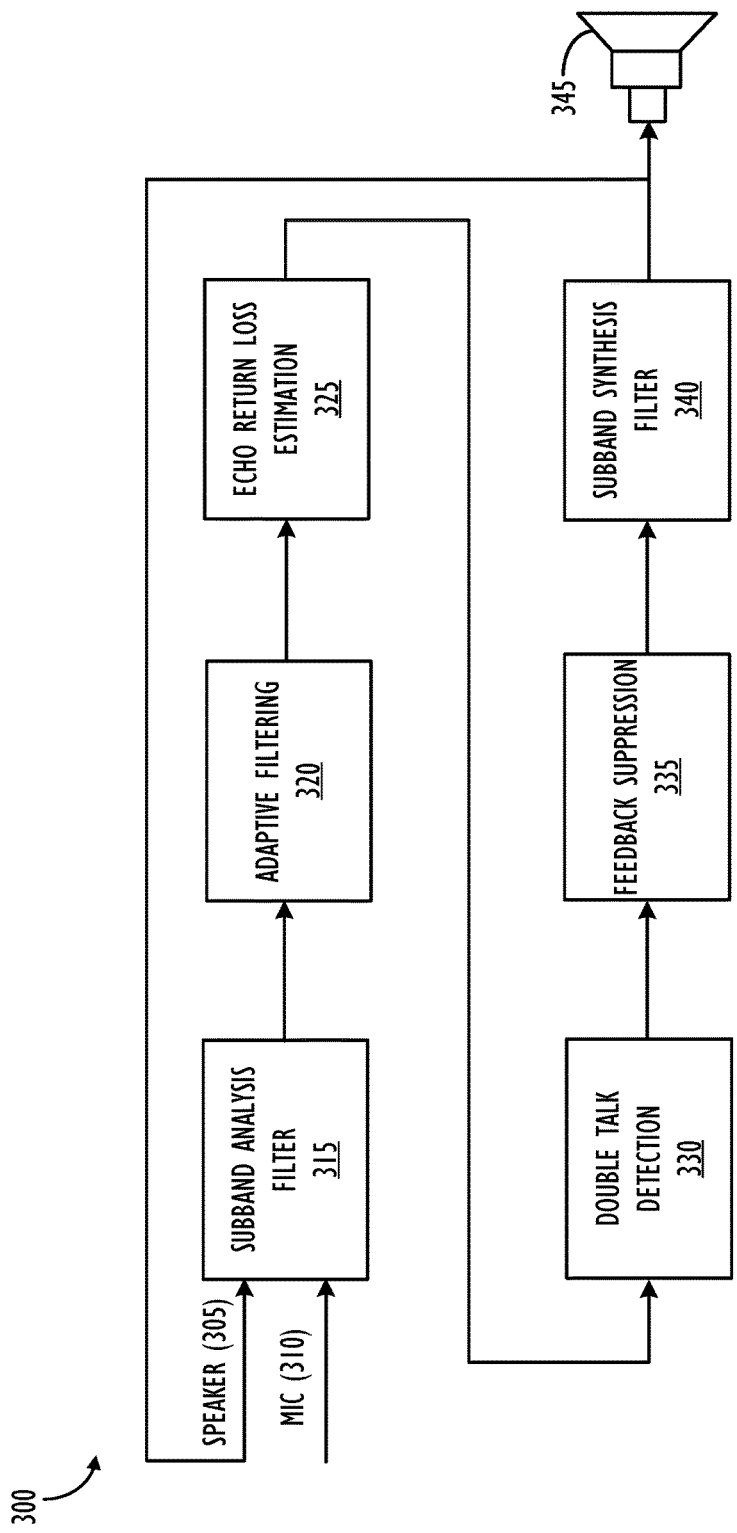
FIG. 3 illustrates a block diagram of an audio feedback elimination algorithm, in accordance with one or more exemplary embodiments disclosed herein.

FIG. 3 shows a block diagram 300 of an audio feedback elimination algorithm, in accordance with one or more exemplary embodiments disclosed herein. The time domain signals Mic (310) and Spk (305) in FIG. 3 may, for example, be sampled at 48 KHz, wherein each sample is assumed to be a floating point variable between −1.0 and 1.0 that has been converted from a 16-bit signed integer audio sample. The signal may be transformed into two independent subband signals, to be used in 128-subband and 256-subband processing (315), for example. The subband decomposition may be based on a set of low-delay filter banks, for example, Polyphase filter banks (e.g., filters using efficient subband decomposition based on symmetries of the processed signals and the inherent filtering properties of a finite impulse response (FIR) filter), and processed at twice the critical sample rate, i.e., the Nyquist frequency.

For the 256-subband processing, only subbands in frequency regions between 0 to 1200 Hz may be processed. The rest of the subbands may be zeroed out. For the 128-subband processing, only the subbands in frequency region between 1000 and 10125 Hz may be processed, while the rest of the subbands are zeroed out. Note that the 256-subband processing may be done once in every two 128-sample frames. The signal processing of both subband data structures may be identical and performed independently as will be described in greater detail below, except that the time-constants may be scaled accordingly for the different frame sizes. Other embodiments may use different subband frequency regions to fit the needs of a particular implementation.

Adaptive Filtering

Moving on to the Adaptive Filtering (320) block of FIG. 3, an adaptive filter is disclosed that may be used to update the two (or more) filter taps, based on the reference signal u(n) (220) and microphone signal y(n) (240), as shown in FIG. 2. In some embodiments, one filter tap may be used for 128 subbands, and one filter tap may be used for 256 subbands. For example, let $Mic_k(n)$ and $Spk_k(n)$ be the complex microphone and speaker $k^{th}$ subbands, respectively, where k=0, . . . , M is the subband index, M is the number of subbands (128 or 256) per frame, and n is the current frame index. In order to present the algorithm as a dual-subband algorithm, k will be defined as belonging to a range frequency region such as k∈[0, 1200 Hz] to imply that k is one of the subband index in the specified frequency region.

Dual-Tap Adaptive Filter

According to some embodiments, the Howling-Killer may consists of two filter taps, for example, transient (i.e., fast) taps and slow taps. The transient taps may be adapted with a larger step size to track the non-stationary echo path, whereas the slow taps may be adapted with a much smaller step size to fine-tune the stationary echo path. Some implementations of the NLMS updating rule introduce too much artifact to the adaptive filtered output because the microphone and speaker signals are highly correlated. Unlike the step size used in a normal AEC, the feedback cancellers described herein may use step sizes that are orders of magnitude smaller, for example, due to the biased least mean square estimate problem that results poor convergent properties.

Various parameters for exemplary 128-subband or 256-subband processing, according to some embodiments, are summarized in TABLE 1, below.

TABLE 1

|  | 256-subband processing | 128-subband processing | Comments |
| --- | --- | --- | --- |
| Processed subbands | Process 0 to 1000 Hz | Process 1000-10125 Hz, and set the rest of the complex subbands to zero |  |
| α for fast taps | 0.5 | 0.5 | Tap smoothing time constant as defined in Eqn. 8a |
| α for slow taps | 0.9 | 0.9 | Tap smoothing time constant as defined in Eqn. 8a |

The following algorithm may be applied to both 128-subband and 256-subband processing and to both the fast and slow tap updates. (Note: The time constants of each subband structure are defined in terms of milliseconds, so they can be scaled appropriately according to the different frame size.)

FOR k∈[0,1200 Hz] in 256-subband processing, and k∈[1000 to 10125 Hz] in 128-subband processing:

Compute the echo estimate:

$$EstEcho_k(n) = \sum_{j=1}^{N_k-1} Taps_{kj}(n) Spk_k(n-j) \qquad \text{(Eqn. 5)}$$

Compute the residual echo:

$$ResEcho_k[n] = Mic_k(n) - EstEcho_k[n] \qquad \text{(Eqn. 6)}$$

Compute the updating factor (error function):

IF (All of the following are true):
  Subband speaker energy>minimum energy threshold;
  Partitioned speaker energy>adaptive-threshold*partitioned speaker noise energy; and
  Subband speaker energy*ERL[partition]>speaker-threshold*subband residual noise energy)
THEN $$\mu_k(n) = StepSize \frac{ResEcho_k[n, m]}{SpkEnergyNLMS_k(n)} \qquad \text{(Eqn. 7a)}$$

ELSE $$\mu_k(n) = 0 \qquad \text{(Eqn. 7b)}$$

END IF

FOR j=0 to $N_k-1$ $$TapsHist_{kj}(n) = \alpha \cdot TapsHist_{kj}(n-1) + (1-\alpha) \cdot \mu_k[n] SPk_{k*(n-j)} \qquad \text{(Eqn. 8a)}$$

$$\text{Taps}_{kj}(n) = \text{Taps}_{kj}(n) + \text{TapsHist}_{kj}(n) \quad \text{(Eqn. 8b)}$$

END FOR j
END FOR k

TapsHist$_{kj}$(n) is the internal filter tap state due to tap-smoothing, and Taps$_{kj}$(n) is the actual smoothed filter tap of the kth subband and jth tap. The IIR smoothing coefficient α for each filter tap (128 or 256, fast or slow) is defined above in TABLE 1.

$N_k$ is the number of taps defining the tail-length in frames (see 4th column in TABLE 2). For example, a 260 msec tail length in a 128-sample frame (2.666 msec) is calculated to have 97 frames. SpkEnergy$_k$ST[n] is the short-term subband speaker energy calculated by a one-pole filter:

$$\text{SpkEnergyST}_k[n] = \alpha_1 \text{SpkEnergyST}_k[n-1] + (1-\alpha_1)\text{SpkEnergy}_k[n] \quad \text{(Eqn. 9)},$$

where $$\alpha_1 = \left(1 - e^{-\frac{2.666\,ms}{40\,ms}}\right) = 0.064493 \quad \text{(Eqn. 10)}$$

and SpkEnergy$_k$(n) is the frame speaker energy computed as the magnitude square of Spk$_k$(n). The filter tap is only updated only if the short-term speaker energy is greater than a minimum threshold (MinThr) as defined in TABLE 2 for each frequency region.

StepSize is the updating constant, which may be set to be 0.03, and $\mu_k[n]$ is the complex NLMS updating factor normalized by one-pole filter output speaker energy, $$\text{SpkEnergyNLMS}_k(n) = \alpha_k \text{SpkEnergyNLMS}(n-1)_k + (1-\alpha_k)\text{SpkEnergy}_k(n), \quad \text{(Eqn. 11)}$$

and the one-pole filter coefficient is defined as:

$$\alpha_k = 1 - e^{-\frac{2.666\,ms}{\text{TailLength}_k}} \quad \text{(Eqn. 12)}$$

The one-pole implementation is more efficient than computing the average of the speaker energy over $N_k$ frames. The filter taps TapsTransient$_{kj}$(n) is a 128×$N_k$ two-dimensional array, where 128 is the number of subbands and N_k is the tail length, as defined above in TABLE 1.

Similarly, the slow tap TapSlow$_k$[n][f] is also updated by Equations 5 to 8, but the StepSize may be set to be significantly smaller than 0.03 (e.g., in some embodiments, a StepSize of 0.005 may be used) to further reduce the audio artifacts resulting from the subband adaptive filtering operations. Using the same terminologies, the resulting residual echo from the slow taps are defined as ResEchoSlow$_k$[n, m].

TABLE 2 below summarizes various Howling-Killer parameters that may be applied, according to some embodiments.

TABLE 2

| Partition # | Partition BW (Hz) | Partition BW (frames index range) | Tail-length msec (# frames) | MinThr$_k$ |
|---|---|---|---|---|
| 0 | DC | 0 | 260 (97) | 0.0002 |
| 1 | 0 < BW ≤ 300 | 1 | 260 (97) | 0.0004 |
| 2 | 300 < BW ≤ 600 | 2, 3 | 260 (97) | 0.0004 |
| 3 | 600 < BW ≤ 1k | 4, 5 | 260 (97) | 0.0001 |
| 4 | 1k < BW ≤ 1.5k | 6, 7, 8 | 260 (97) | 0.0001 |
| 5 | 1.5k < BW ≤ 2.1k | 9, 10, 11 | 260 (97) | 0.00005 |
| 6 | 2.1k < BW ≤ 3k | 12 ≤ n ≤ 16 | 260 (97) | 0.00005 |
| 7 | 3k < BW ≤ 4k | 17 ≤ n ≤ 21 | 220 (82) | 0.00005 |
| 8 | 4k < BW ≤ 5k | 22 ≤ n ≤ 26 | 220 (82) | 0.00005 |
| 9 | 5k < BW ≤ 7k | 27 ≤ n ≤ 37 | 160 (60) | 0.00005 |
| 10 | 7k < BW ≤ 10k | 38 ≤ n ≤ 53 | 120 (45) | 0.00005 |
| 11 | 10k < BW ≤ 14k | 54 ≤ n ≤ 73 | 100 (37) | 0.00005 |
| 12 | 14k < BW ≤ 22k | 74 ≤ n ≤ 116 | 50 (18) | 0.00005 |

Selecting the Best Filtered Output (Also Referred to as "Tap-Switching")

As described below, the variables ResEchoTransient$_k$(i) and ResEchoSlow$_k$(i) refer to the residual echo output of the transient and slow taps, respectively. These two complex variables may be used in selecting the best residual echo output for the loudspeaker. The adaptive filter output may then be chosen using the following test conditions:

IF (ResEchoEnergySlow$_k$(n)>ResEchoEnergyTransient0$_k$(n) for 50 msec

&& TapSwitchHangOverTime has expired) (Eqn. 13)

ResEchoBest$_k$[n]=ResEchoTransient$_k$[n] (Eqn. 13a)

EstEchoBest$_k$[n]=EstEchoTransient$_k$[n] (Eqn. 13b)

Set TapSwitchHangOverTime 260 msec

ELSE IF (ResEchoEnergySlow$_k$(n) ≤ResEchoEnergyTransient0$_k$(n) for 50 msec

&& TapSwitchHangOverTime has expired) (Eqn. 14)

ResEchoBest$_k$[n]=ResEchoSlow$_k$[n] (Eqn. 14a)

EstEchoBest$_k$[n]=EstEchoSlow$_k$[n] (Eqn. 14b)

Set TapSwitchHangOverTime to 260 msec
END

The energy terms of the above conditional statements may, for example, be computed as the square magnitude (i.e., $\|x\|^2=\text{real}(x)^2+\text{Imag}(x)^2$) of the residual echo complex values of the three different filter taps.

Echo Return Loss (ERL) Estimation

According to some embodiments, a state machine may be employed, e.g., comprising states of: 'single-talk' (i.e., only local audio is present); 'double-talk' (i.e., both local and remote audio are present); or 'idle' (i.e., when no audio is present). Turning to box (325) of FIG. 3, the echo return loss is the ratio of the energy of the microphone signal (e.g., signal y(n) (240) of FIG. 2) to the energy of the loudspeaker signal (e.g., signal u(n) (220) of FIG. 2) during 'single-talk.' Rather than relying on the microphone signal, the embodiments described herein may use the estimated echo from the adaptive filter, thereby making the ERL computation independent of the single-talk/overlapping-talk state machine. The ERL may be defined by partitions of subbands, for example, as shown above in TABLE 4.

Partitioning Speaker Energy and Noise

The process of partitioning may begin by grouping complex subbands Spk$_k$(n) into 13 partitions, as shown in Equation 15:

$$\text{SpkPart}_p(n) = \sum_{j=lo(p)}^{hi(p)} \|\text{Spk}_k(j)\|^2 \quad \text{(Eqn. 15)}$$

where Mag(x) is the magnitude square of the complex number x, lo(p) and hi(p) are the lowest and highest subband of the $p^{th}$ partition (as shown in the second column of Table 1). Similarly, the estimate echo subbands are also grouped into 13 partitions of energy bins, as shown in Equation 16:

$$EstEchoPart_p(n) = \sum_{j=lo(p)}^{hi(p)} \|EstEchoBest_k(j)\|^2. \quad \text{(Eqn. 16)}$$

The corresponding short-time average energy values of Equations 15 and 16 are computed as:

$$SpkPartST_p[n] = (1-\alpha_2)SpkPartST_p(n-1) + \alpha_2 SpkPart_p(n) \quad \text{(Eqn. 17)}$$

$$EstEchoPartST_p[n] = (1-\alpha_2)EstEchoPartST_p(n-1) + \alpha_2 EstEchoPart_p(n), \quad \text{(Eqn. 18)}$$

where $\alpha_2$ is the 40 ms one-pole filter coefficient derived from Equation 10.

The noise floor of the speaker energy may be defined by the following conditional equations. The noise floor is updated with a rate SlowGrowRate=0.2 dB per second, or $$10^{\frac{0.2}{10 \times FramePerSec}}$$

per frame, until when the minimum frame energy has not been found in the last 4 seconds, then the updating rate becomes faster with a rate FastGrowRate=2 dB per second, or $$10^{\frac{2}{10 \times FramePerSec}}$$

per frame. Note that $$FramePerSec = \frac{48000}{128} = 375$$

for the 128-sample frame.

The following loop may be used to compute the noise energy for all the signals used in the Howling Killer embodiments described herein:
REPEAT for p=0, 1, . . . , 12

IF SpkEnergyPartST$_p$(n)>SpkNoisePart$_p$(n) (Eqn. 19)

INCREMENT NumSinceNewMin by one frame (Eqn. 20)

IF NumSinceNewMin<4 seconds (Eqn. 21)

SpkNoisePart$_p$(n)=SpkNoisePart$_p$(n)×SlowGrowRate (Eqn. 22a)
ELSE

SpkNoisePart$_p$(n)=SpkNoisePart$_p$(n)×FastGrowRate (Eqn. 22b)
END
ELSE

NumSinceNewMin=0 (Eqn. 23)

SpkNoisePart$_p$[n]=(1-α$_3$)SpkNoisePart$_p$(n-1)+ α$_3$SpkEnergyPart$_p$(n) (Eqn. 24)
END
END The one pole filter coefficient $\alpha_2$ may be set to 25 ms. The noise floor may then track the minimum speaker energy, and gradually increase to a new noise floor if no minimal energy has been found within the last 4 seconds.

The speaker signal activity detector is used in a later part of the partitioning algorithm. It is based on the threshold comparison between the speaker signal and its noise floor.

IF SpkEnergyPartST$_p$(n)>Thr×SpkNoisePart$_p$(n) (Eqn. 25a)

AND SpkEnergyPartST$_p$(n)>MinThr$_p$ (Eqn. 25b)

SET HangOverTimeFarTalk to 80 ms. (Eqn. 26)

END
HangOverTimeFarTalk is decremented by 2.666 or 5.333 msec per frame until zero.

ERL Calculation

According to some embodiments, the Echo Return Loss (ERL) may be calculated according to two steps: 1) Find the ERL_Ratio of the current frame; and 2) Smooth the ERL_Ratio with a slow time-varying parameter. The different constants that are used in the following ERL calculation are listed in TABLE 2. TABLE 3, below, shows various constants that may be used in updating the ERL.

TABLE 3

| | |
|---|---|
| Thr$_{erl}$ | 4.0 |
| MinThr$_k$ | Last Column TABLE 1 |
| MIN_ERL | 0.1 |
| MAX_ERL | 1000 |
| GrowRate$_{erl}$ | 40 dB/sec or $10^{\frac{40}{10 \times 375}}$ per frame |
| α$_4$ | 50 msec |

Pseudocode for determining the ERL, according to some embodiments, may be as follows:
REPEAT FOR p=0, . . . , 12

IF SpkPartST$_p$(n)>Thr$_{erl}$×SpkNoisePart$_p$(n) (Eqn. 27a)

AND SpkPartST$_p$(n)>MinThr$_k$ (Eqn. 27b)

$$ERL\_Ratio_p(n) = \frac{EstEchoPartST_p(n)}{SpkPartST_p(n)} \quad \text{(Eqn. 28)}$$

CLIP: MAX_ERL≥ERL_Ratio≥MIN_ERL (Eqn. 29)

IF ERL_Ratio$_p$(n)>ERL$_p$(n) (Eqn. 30)

RAMP UP: ERL$_p$(n)=ERL$_p$(n)×GrowRate$_{erl}$ (Eqn. 31)
ELSE

DECAY: ERL$_p$(n)=(1-α$_4$)ERL$_p$(n)+α$_4$ERL_Ratio$_p$(n) (Eqn. 32)
END
END
END Overlapping-Talk Detection Turning to box (330) of FIG. 3, the ERL$_p$[n] may be used to estimate the overlapping-talk state of the audio system, e.g., based on the loudspeaker signal, u(n) (220), and the microphone signal, y(n) (240), which estimate will then be later used in the echo suppression module (335). The overlapping-talk detector function is defined as the sum of ratios of the residual echo energy to the loudspeaker energy, as seen at the microphone for a group of subbands:

$$SumMicSpkRatio(n) = \sum_{j=lo_{DT}}^{hi_{DT}} \frac{ResEchoEnergyClean_j(n)}{SpkEnergyST_j(n) \times ERL_p(n)}, \quad \text{(Eqn. 33)}$$

where the noise removed residual subband energy is defined as:

ResEchoEnergyClean$_j(n)$=min(0,ResEchoEnergy-Clean$_j(n)$-Thr$_{res}$×ResEchoNoise$_j(n)$)     (Eqn. 34), where Thr$_{res}$=8, and ResEchoNoise$_j(n)$ is the noise floor of ResEchoEnergy$_j(n)$ estimated using the same updating rules defined in Equations 19 to 24 for all subbands. The number of subbands used in the microphone speaker sum ratio in Equation 33 is summed over the [lo$_{DT}$=1, hi$_{DT}$=42]. Note that ERL$_p(n)$ depends on the mapping of the subband index j to the partition defined in TABLE 1.

The overlapping-talk detector function may be applied if the value of the microphone speaker sum ratio is greater than a predefined threshold for and three consecutive frames.

IF SumMicSpkRatio($j$)>THR$_{dt}$ for $j=n,n-1,n-2$,     (Eqn. 35)

SET HangOverTime$DT$ to 80 ms     (Eqn. 36)

END IF

DECREMENT HangOverTime$DT$ by 2.66666 ms/frame until 0     (Eqn. 37)

Thus, overlapping-talk may be present as long as the hang over time is non-zero. The overlapping-talk states is set to one of the four states (i.e., "DT": both speaker and local audio active; "RX": only speaker audio active; "TX": only local audio active; or "IDLE": no signal activity), based on the hand over time and speaker energy, as in:

IF Hang OverTimeFarTalk>0 AND HangOverTimeDT>0

AEC_State=DT     (Eqn. 38)

ELSE IF HangOverTimeFarTalk>0

AEC_State=RX     (Eqn. 39)

ELSE IF HangOverTimeLocalTalk>0

AEC_State=RX     (Eqn. 40)

ELSE

AEC_State=IDLE     (Eqn. 41)

The state parameter AEC_State will be referred back to in the nonlinear echo suppression module section below.

Nonlinear Echo Suppression

Turning to box (335) of FIG. 3, feedback suppression, for example, in the form of nonlinear echo suppression, is used to de-correlate the microphone and loudspeaker signals and consequently helps reduce the amount of reverberation in the resulting room audio. Echo suppression of the two adaptive filter output subband signals may be based, at least in part, on the acoustic feedback estimate (245), the double talk state machine information, and the ERL.

The estimated echo subbands, EstEchoBest$_k[n]$, which is computed in Equations 13 to 14, are grouped into 20 bins of energy values. The ranges to group the subband energy values to each bin are denoted as (lo$_s$, hi$_s$) in TABLE 4. The running sums for the estimate echo and the residual echo subband energy may be defined as:

$$EstEchoSum_p[n] = \sum_{j=lo_s}^{hi_s} \|EstEchoBest_j(n)\|^2 \text{ and} \quad \text{(Eqn. 42)}$$

$$ResEchoSum_p[n] = \sum_{j=lo_s}^{hi_s} \|ResEchoBest_j(n)\|^2 \quad \text{(Eqn. 43)}$$

The running peak of the estimate echo may then be calculated as:

IF EstEchoSum$_p[n]$>EstEchoPeak$_p[n]$

SET EstEchoPeak$_p[n]$=EstEchoSum$_p[n]$     (Eqn. 44)

ELSE EstEchoPeak$_p[n]$=EstEchoSum$_p[n]$×Decay-Rate$_s$     (Eqn. 45), where DecayRate$_s$ is set to −120 dB per second (or $$10^{\frac{-120}{10*375}}$$

per frame for 128-sample frame).

The running sums of each bin of the estimate echo and the residual echo may then be compared, and bins that appear to have "good" adaptive filtering cancellation are suppressed entirely.

Table 4 below shows an exemplary suppression frequency bin partitioning scheme for 128 subbands at a 48 k Hz sampling rate.

TABLE 4

| Bin # | Suppression BW (lo$_s$, hi$_s$) |
|---|---|
| 0 | 0 |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10, 11 |
| 11 | 12, 13 |
| 12 | 14, 15 |
| 13 | 16 . . . 18 |
| 14 | 19 . . . 21 |
| 15 | 22 . . . 25 |
| 16 | 26 . . . 31 |
| 17 | 32 . . . 37 |
| 18 | 38 . . . 46 |
| 19 | 47 . . . 128 |

The echo suppression parameters may be set based on the state of the AEC state machine, for example, according to the following pseudocode:

IF AECState=DT

SET $T_s$=1 and $SWLOSS(n)$=max(0.707,$SWLOSS(n)$×DecayRate$_{swl}$)     (Eqn. 46)

ELSEIF AECState=RX

SET $T_s$=0 and $SWLOSS[n]$=max(0.707,$SWLOSS(n)$×DecayRate$_{swl}$)     (Eqn. 47)

ELSEIF AECState=TX

SET $T_s$=∞ and $SWLOSS(n)$=min(1,$SWLOSS(n)$×GrowRate$_{swl}$)     (Eqn. 48)

ELSE AECState=IDLE $$\text{SET } T_s=\infty \text{ and } SWLOSS(n)=\min(1,SWLOSS(n)\times \text{GrowRate}_{swl}) \quad \text{(Eqn. 49)},$$

where $T_s$ is the threshold used to decide gating, and in TX and IDLE states suppression is disabled. SWLOSS(n) is the attenuation (up to 3 dB) applied to the output.

The actual gain value of each frequency bin is decided by the following conditional equations:

$$\text{IF EstEchoPeak}_p[n] > T_s \times \text{ResEchoPeak}_p(n) \quad \text{(Eqn. 50)}$$

$$\text{GATE ON: Gain}_p[n]=\max(0.707, \text{Gain}_p[n]+\text{DecStepSize}) \quad \text{(Eqn. 51)}$$

ELSE $$\text{GATE OFF:Gain}_p[n]=\min(1,\text{Gain}_p[n]+\text{IncStepSize}) \quad \text{(Eqn. 52)}$$

The echo suppression may be performed by scaling each complex subband by the gain and swltchloss parameters may be described as follows:
REPEAT for k∈[0,1200 Hz] in 256-subband, and k∈[1000 to 10125 Hz] in 128-subband processing $$\text{ResEchoBestOutput}_k(n)=\text{ResEchoBest}_k(n)\times \text{Gain}_p(n)\times SWLOSS(n) \quad \text{(Eqn. 53)},$$

where $\text{Gain}_p(n)$ is a function of the subband index as defined by the mapping in TABLE 3.

Subband Synthesis Filter

Turning to box (340) of FIG. 3, the subband synthesis filter is now described in greater detail. According to some embodiments, box 340 does the reverse of block (315), i.e., it reconstructs the time domain signal by synthesizing the two subband signals (e.g., the 128 subband signal and then 256 subband signal). Both 128-subband and 256-subband signals may be fed to the two corresponding synthesis filter banks, which reconstruct two time domain signals. Note that the 256-subband processing is only done once per two 128-subband processing operations. The actual processed time domain output y[n] is the overlapping-subtraction of the two respective reconstructed subband signals $y_{128}[n]$ and $y_{256}[n]$, i.e.:

$$y[n]=y_{128}[n]-y_{256}[n+1] \quad \text{(Eqn. 54)},$$

where, for even-frames, I=0, and, for odd frames, I=128. The subtraction of the two signals is due to the 200 Hz overlapping region added to the 256-subband processing.

Figure 4:
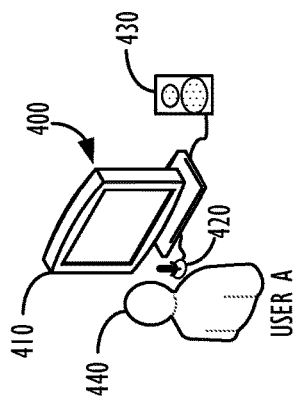
FIG. 4 illustrates an embodiment of an exemplary PA system of FIGS. 1-3, in accordance with one or more exemplary embodiments disclosed herein.

FIG. 4 shows an exemplary PA system 400 comprising a display 410, a microphone 420 and a speaker assembly 430. A user, labeled "User A," 440 can use the PA system 400 to amplify his or her voice in a public address setting, for example, as described above with reference to FIG. 1. Although FIG. 4 illustrates that the PA system 400 comprises one display 410, one microphone 420, and one speaker assembly 430, it is to be understood that the PA system 400 may comprise more than one display 410, more than one microphone 420, such as a plurality of microphones providing wide angle coverage, and/or more than one speaker assembly 430.

Figure 5:
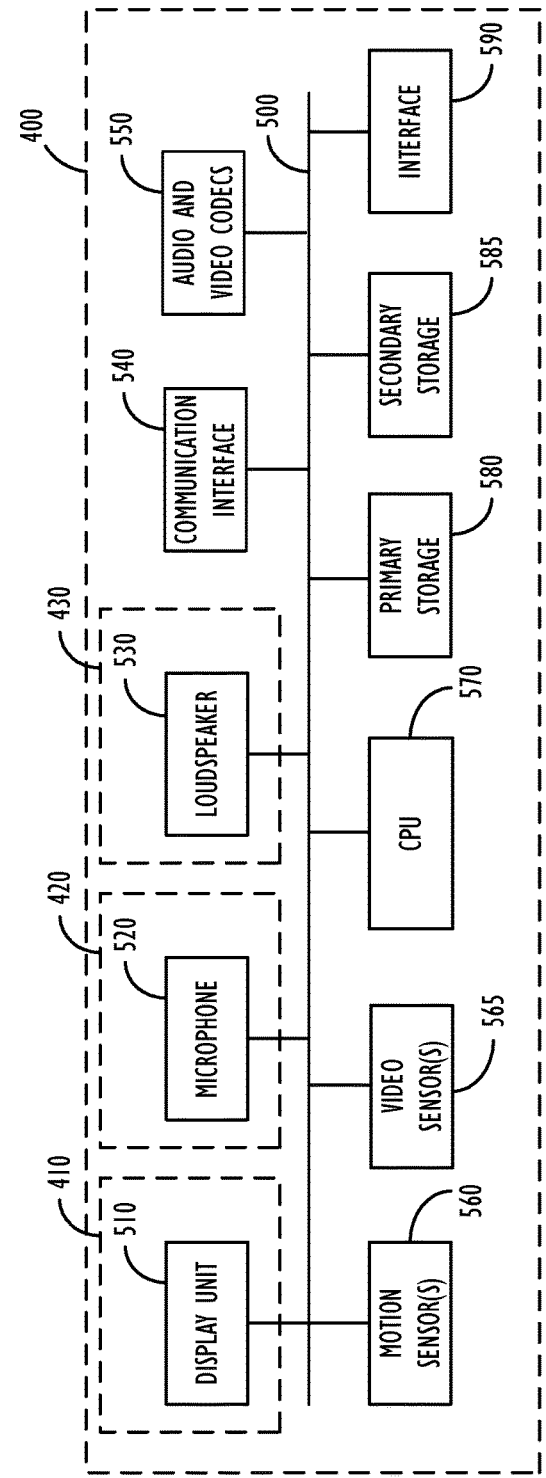
FIG. 5 illustrates a block diagram of an embodiment of an exemplary PA system of FIGS. 1-3, in accordance with one or more exemplary embodiments disclosed herein.

FIG. 5 shows an exemplary block diagram of the exemplary PA system 400. The PA system 400 may comprise one or more display units 510, one or more microphones 520, one or more loudspeakers 530, a communication interface 540, audio and video codecs 550, one or more motion sensor(s) 560 one or more video sensors 565 (for example, integrated into display unit 510 or externally connected to display unit 510), one or more CPUs 570, a primary storage 580, a secondary storage 585, and an interface 590, for example, connected via a common data bus 500.

The display unit 510 may reproduce video signals and may, for example, be an LED display panel, a plasma display panel, an OLED display panel, an LCD display panel, an LED-backlit LCD display panel, a cathode ray tube, etc.

The microphone 520 may comprise one or more microphones for capturing the voice and sound of one or more users (for example, the User A 440).

The loudspeaker 530 may be disposed within the speaker assembly 430. The loudspeaker 530 may reproduce audio signals representing the voice of the speaker using the PA system and/or one or more other users at a different location(s). The communication interface 540 may include a network interface, such as a wireless interface, an Ethernet interface, a connection to a PSTN, etc. for sending and receiving communication signals over a network.

The audio and video codecs 550 can include audio and video compression hardware, software, or a combination of hardware and software. The software portion of the audio and video codecs 550 may be tangibly stored in the secondary storage 585. Audio codecs can include, but are not limited to, G.711, G.723, G.726, G.728, G.729, etc. of the International Telecommunication Union Telecommunication Standardization Sector (ITU-T). Video codecs can include, but are not limited to, H.263, H.264, H.265 etc. of the ITU-T.

The one or more motion sensors 560 may comprise one or more sensors for detecting objects in motion in the vicinity of the PA system 400. The one or more motion sensors 560 may be passive infrared sensors, microwave sensors, ultrasonic sensors, etc. The interface 590 may provide the user 240a with an interface to functionality of the PA system 400 The one or more video sensors 565 may comprise one or more sensors for capturing video images in the vicinity of the PA system 400.

The CPU 570 may comprise one or more microprocessors. The primary storage 580 may be any kind of computer memory, such as any kind of addressable semiconductor memory, such as volatile memory, nonvolatile (for example, non-transitory) memory, or a combination of volatile and nonvolatile memory. Nonvolatile memory may include any of ROM, PROM, EPROM, and EEPROM memory. Volatile memory may include any of RAM (for example, SRAM, DRAM, etc.), and CPU cache memory, such as static RAM, SRAM, etc. The secondary storage 585 may be any kind of tangible computer-readable medium, such as a magnetic medium, for example, a computer hard drive; an optical medium, such as an optical disc; a solid-state memory, like a flash memory; and other such non-transitory storage media.

Any of the functionality performed by the CPU 570 described herein may be implemented in software code or instructions that are tangibly stored on the secondary storage 585. Upon loading the software instructions into the primary storage 580 from the secondary storage 585 and executing such software code or instructions by the CPU 570, the CPU 570 may perform any of the functionality of the PA system 400 or the CPU 570 described herein, including any of the functions described above with respect to FIGS. 2 and 3.

Example Embodiments of this Disclosure Include

Example A

A system for eliminating audio acoustic feedback, comprising: one or more speakers configured to produce an output audio signal; one or more microphones configured to capture an input audio signal, wherein the input audio signal may comprise at least a portion of the output audio signal; an audio mixer operatively coupled to the one or more microphones; an audio amplifier operatively coupled to the one or more speakers; and a feedback elimination system operatively coupled between the audio mixer and the audio amplifier, the feedback elimination system configured to: analyze, using a dual-subband data structure with a first crossover frequency, the input audio signal, wherein each subband comprises two or more adaptive filter taps; estimate an echo return loss in the input audio signal; detect a double talk condition in the input audio signal; suppress echo in the input audio signal based, at least in part, on the analysis of the input audio signal, the estimated echo return loss, and the detected double talk condition; and synthesize the output audio signal based, at least in part, on the input audio signal with suppressed echo.

Example B

The system of example A, wherein each adaptive filter tap is smoothed over time.

Example C

The system of either of the preceding examples, wherein the first crossover frequency is 1000 Hz.

Example D

The system of any of the preceding examples, wherein the dual-band data structure uses a 128-subband decomposition and a 256-subband decomposition operation.

Example E

The system of any of the preceding examples, wherein synthesizing the output audio signal based, at least in part, on the input audio signal with suppressed echo, comprises overlap-adding the frequency range from zero Hz to the crossover with the frequency range greater than the crossover frequency.

Example F

The system of any of the preceding examples, wherein the two or more adaptive filter taps comprise a transient filter tap and a slow filter tap.

Example G

A non-transitory computer readable storage medium storing instructions for eliminating audio acoustic feedback, the instructions executable by at least one processor and comprising instructions to: receive an input audio signal from one or more microphones, the input audio signal comprising at least a portion of a first output audio signal produced by one or more speakers; analyze, using a dual-subband data structure with a first crossover frequency, the input audio signal, wherein each subband comprises two or more adaptive filter taps; estimate an echo return loss in the input audio signal; detect a double talk condition in the input audio signal; suppress echo in the input audio signal based, at least in part, on the analysis of the input audio signal, the estimated echo return loss, and the detected double talk condition; and synthesize a second output audio signal based, at least in part, on the input audio signal with suppressed echo.

Example H

The non-transitory computer readable storage medium of example G, wherein each adaptive filter tap is smoothed over time.

Example I

The non-transitory computer readable storage medium of any of examples G-H, wherein the first crossover frequency is 1000 Hz.

Example J

The non-transitory computer readable storage medium of any of examples G-I, wherein the dual-band data structure uses a 128-subband decomposition and a 256-subband decomposition operation.

Example K

The non-transitory computer readable storage medium of any of examples G-J, wherein the instructions to synthesize the output audio signal based, at least in part, on the input audio signal with suppressed echo, comprises overlap-adding the frequency range from zero Hz to the crossover with the frequency range greater than the crossover frequency.

Example L

The non-transitory computer readable storage medium of any of examples G-K, wherein the two or more adaptive filter taps comprise a transient filter tap and a slow filter tap.

Example M

The non-transitory computer readable storage medium of any of examples G-L, wherein the instructions further comprise instructions to transmit the second output audio signal to the one or more speakers.

The embodiments shown and described above are explicative examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A system for eliminating audio acoustic feedback, comprising:
one or more speakers configured to produce an output audio signal;
one or more microphones configured to capture an input audio signal, wherein the input audio signal may comprise at least a portion of the output audio signal;
an audio mixer operatively coupled to the one or more microphones;
an audio amplifier operatively coupled to the one or more speakers; and a feedback elimination system operatively coupled between the audio mixer and the audio amplifier, the feedback elimination system configured to:

analyze, using a subband data structure having a crossover frequency, the input audio signal, wherein the subband data structure uses a first subband decomposition operation and a second subband decomposition operation, and wherein each subband comprises two or more adaptive filter taps;

estimate an echo return loss in the input audio signal;

detect a double talk condition in the input audio signal;

suppress echo in the input audio signal based, at least in part, on the analysis of the input audio signal, the estimated echo return loss, and the detected double talk condition; and synthesize the output audio signal based, at least in part, on the input audio signal with suppressed echo.

2. The system of claim 1, wherein each adaptive filter tap is smoothed over time.

3. The system of claim 1, wherein the crossover frequency is 1000 Hz.

4. The system of claim 1, wherein the first subband decomposition operation is a 128-subband decomposition operation and the second subband decomposition operation is a 256-subband decomposition operation.

5. The system of claim 1, wherein synthesizing the output audio signal based, at least in part, on the input audio signal with suppressed echo, comprises overlap-adding a first frequency range from zero Hz to the crossover frequency with a second frequency range greater than the crossover frequency.

6. The system of claim 1, wherein the two or more adaptive filter taps comprise a transient filter tap and a slow filter tap.

7. The system of claim 1, wherein the first subband decomposition operation is different from the second subband decomposition operation.

8. A non-transitory computer readable storage medium storing instructions executable by at least one processor and comprising instructions to:

receive an input audio signal from one or more microphones, the input audio signal comprising at least a portion of a first output audio signal produced by one or more speakers, the input audio signal having a frequency range;

analyze, using a subband data structure with at least one crossover frequency, the input audio signal, wherein the subband data structure uses a first subband decomposition operation and a second subband decomposition operation, and wherein each subband comprises one or more adaptive filter taps;

estimate an echo return loss in the input audio signal;

detect a double talk condition in the input audio signal;

suppress echo in the input audio signal based, at least in part, on the analysis of the input audio signal, the estimated echo return loss, and the detected double talk condition; and synthesize a second output audio signal based, at least in part, on the input audio signal with suppressed echo.

9. The non-transitory computer readable storage medium of claim 8, wherein each adaptive filter tap is smoothed over time.

10. The non-transitory computer readable storage medium of claim 8, wherein the at least one crossover frequency is 1000 Hz.

11. The non-transitory computer readable storage medium of claim 8, wherein the first subband decomposition operation is a 128-subband decomposition operation and the second subband decomposition operation is a 256-subband decomposition operation.

12. The non-transitory computer readable storage medium of claim 8, wherein the instructions to synthesize the output audio signal based, at least in part, on the input audio signal with suppressed echo, comprise instructions to overlap-add a first frequency range from zero Hz to the crossover frequency with a second frequency range greater than the crossover frequency.

13. The non-transitory computer readable storage medium of claim 8, wherein the one or more adaptive filter taps comprise a transient filter tap and a slow filter tap.

14. The non-transitory computer readable storage medium of claim 8, wherein the instructions further comprise instructions to transmit the second output audio signal to the one or more speakers.

15. The non-transitory computer readable storage medium of claim 8, wherein the first subband decomposition operation is different from the second subband decomposition operation.

16. An audio feedback elimination system comprising one or processors configured to:

receive an input audio signal from one or more microphones, the input audio signal comprising at least a portion of a first output audio signal produced by one or more speakers, the input audio signal having a frequency range;

analyze, using a subband data structure with at least one crossover frequency, the input audio signal, wherein the subband data structure uses a first subband decomposition operation and a second subband decomposition operation, and wherein each subband comprises one or more adaptive filter taps;

estimate an echo return loss in the input audio signal;

detect a double talk condition in the input audio signal;

suppress echo in the input audio signal based, at least in part, on the analysis of the input audio signal, the estimated echo return loss, and the detected double talk condition; and synthesize a second output audio signal based, at least in part, on the input audio signal with suppressed echo.

17. The audio feedback elimination system of claim 16, wherein each adaptive filter tap is smoothed over time.

18. The audio feedback elimination system of claim 16, wherein the at least one crossover frequency is 1000 Hz.

19. The audio feedback elimination system of claim 16, wherein the first subband decomposition operation is a 128-subband decomposition operation and the second subband decomposition operation is a 256-subband decomposition operation.

20. The audio feedback elimination system of claim 16, wherein synthesizing the output audio signal based, at least in part, on the input audio signal with suppressed echo, comprises overlap-adding a first frequency range from zero Hz to the crossover frequency with a second frequency range greater than the crossover frequency.

* * * * *